United States Patent [19]

Scott et al.

[11] Patent Number: 4,463,322
[45] Date of Patent: Jul. 31, 1984

[54] SELF-BIASING FOR FET-DRIVEN MICROWAVE VCOS

[75] Inventors: Bentley N. Scott, Richardson; Gailon E. Brehm, Plano, both of Tex.

[73] Assignee: Texas Instruments Incorporated, Dallas, Tex.

[21] Appl. No.: 292,769

[22] Filed: Aug. 14, 1981

[51] Int. Cl.³ .......... H03B 5/00; H01L 27/04
[52] U.S. Cl. .......... 331/117 D; 331/177 V; 357/14; 357/15; 357/22; 357/41; 357/51
[58] Field of Search .......... 331/117 D, 177 V; 357/15, 22, 14

[56] References Cited

U.S. PATENT DOCUMENTS 4,135,168  1/1979  Wade .......... 357/15
4,189,688  2/1980  Sechi et al. .......... 331/177 V

OTHER PUBLICATIONS

Scott et al., "Octave Band Varactor-Tuned GaAs Fet Oscillators", IEEE Internation Solid State Conference, New York, Feb. 1981, pp. 138-139.
Rauscher, "Large Signal Tech. for Designing Single Frequency & Voltage-Controlled GaAs FET Oscillators", IEEE Microwave Theory & Tech., vol. MTT-29, No. 4, 4/81.
Rauscher, "Broad Band Varactor-Tuned GaAs FET Oscillators", Electronic Letters, vol. 16, No. 14, Jul. 1980.
Wade, "X-Band Reverse Channel GaAS FET Power VCO", Microwave Journal, vol. 21, Apr. 1978, p. 92.

Primary Examiner—John S. Heyman
Assistant Examiner—Timothy P. Callahan
Attorney, Agent, or Firm—Robert Groover; Melvin Sharp; James T. Comfort

[57] ABSTRACT

A microwave voltage-controlled oscillator includes a varactor-controlled tuned circuit connected to the gate of an FET. The gate of the FET forms a Schottky barrier contact with the channel region. This Schottky barrier operates to clip the RF voltages generated in the gate circuit, and this clipping is used to provide the necessary gate bias to set the operating point of the VCO. No other source of bias is provided, and thus no DC return path from the gate circuit to the source or drain of the FET exists. Thus, the other circuit elements normally required to establish the gate operating point, which would have high frequency resonances, are eliminated. This permits operation of a microwave VCO over an extremely broad bandwidth.

8 Claims, 5 Drawing Figures

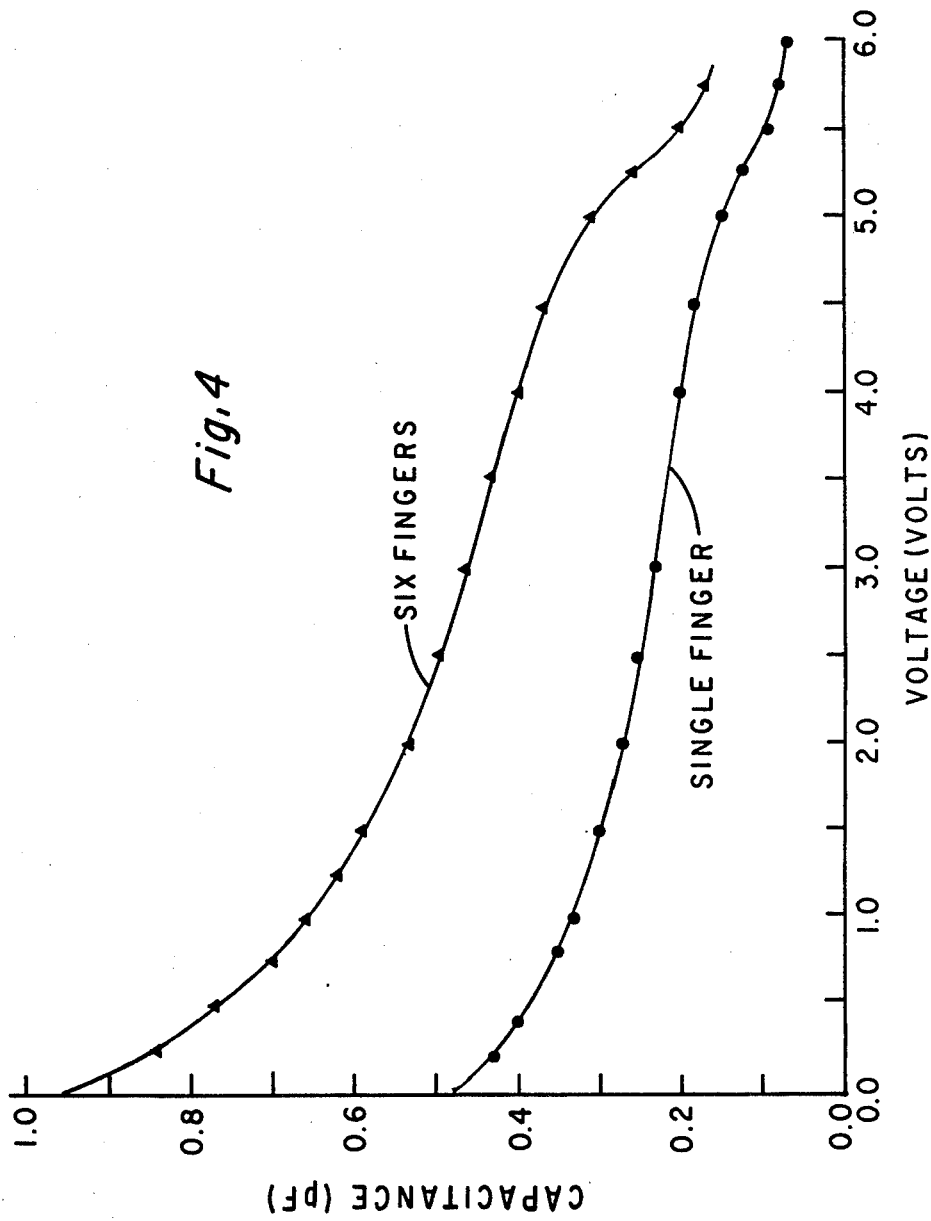

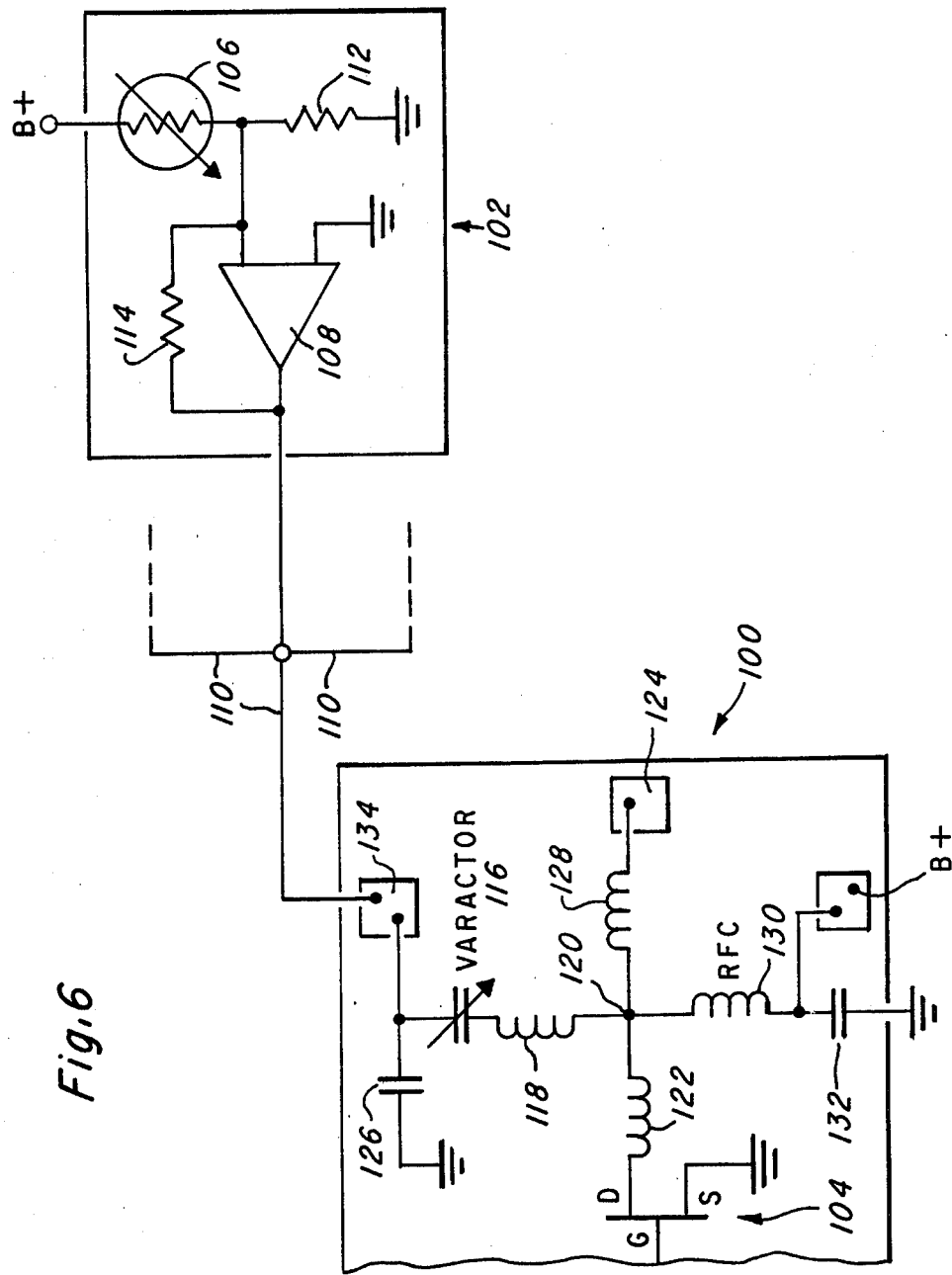

SELF-BIASING FOR FET-DRIVEN MICROWAVE VCOS

CROSS-REFERENCE TO RELATED APPLICATIONS

The following applications of common assignee and filed concurrently with the present application contain related subject matter and are hereby incorporated by reference: TI-8887, Wide-Ratio Monolithic Microwave Varactor; TI-8990, Varactor Trimming for MMICs; TI-8988, Monolithic Microwave Wide-Band VCO.

BACKGROUND OF THE INVENTION

The present invention relates to a wide-band microwave voltage-controlled oscillator (VCO).

A common and convenient way to configure a VCO is by using a varactor to change the resonance point of a tuned circuit, and connecting this tuned circuit to the gate of an FET which supplies the necessary gain for oscillation. However, as is well known in the art, the gate must also be biased to an appropriate operating point, to provide adequate gain and power output from the FET. While many circuits to set the gate operating point are known, they commonly have the difficulty that the elements (lumped or even distributed) used to set the DC gate bias have their own high frequency resonances. Where it is desired to configure a microwave VCO, such spurious resonances may commonly fall within the band of interest, and thus interfere with proper operation of the VCO.

Thus, it is an object of the present invention to provide a VCO wherein bias is provided to set the operating point without producing additional spurious resonances in the tuned resonance section of the VCO.

In particular, when it is desired to configure a very wide band VCO, the chance that a spurious resonance occurring in the DC return path which is conventionally used to set gate bias may fall within the bandwidth of interest is very large.

Thus, it is a particular object of the present invention to provide a gate-bias circuit for a very wide band VCO.

Normally, the frequency tuning range of varactor-based VCO is much narrower than the capacitance range of the tuning varactor, due to the inherent and parasitic reactance characteristics of FETs and other components of the VCO. In particular, an extremely wide-range varactor (having a capacitance ratio of a decade or more) is needed if the frequency range of the VCO is to remotely approach one octave. In particular, to exploit the tuning range provided by the varactor in the tuned gate-control circuit, it is highly desirable to minimize the parasitic reactances which narrow the frequency-tuning ratio of a VCO which can be attained based on a given capacitance-tuning ratio of the varactor included in the VCO.

Thus, it is a further object of the present invention to provide a VCO having a frequency-tuning range which is a substantial fraction of the capacitance-tuning range of a varactor included in the VCO.

Thus, it is an object of the present invention to provide a VCO having a tuning range of 1.5 to 1 or larger at microwave frequencies. It is a further object of the present invention to provide a VCO having a tuning range of 1.3 to 1 or better at microwave frequencies above 5 GHz.

It is a further object of the present invention to provide a microwave VCO having a tuning range of an octave or more.

It is a further object of the present invention to provide a monolithic microwave VCO having a tuning range of 1.5 to 1 or larger.

SUMMARY OF THE INVENTION

The present invention provides a method of gate biasing, with no additional spurious resonances or circuit elements introduced, for FET-driven microwave VCOs. An FET is used in which the gate forms a Schottky barrier contact to the channel, and the Schottky barrier (diode) thus formed operates to clip the RF signal which appears across the barrier whenever the RF signal exceeds the barrier-height potential. The clipping thus induced is a self-regulated source of potential. Charge pumped across the Schottky barrier charges the gate circuit, and thus sets the operating point appropriately.

The preferred embodiment of the present invention is monolithic, and includes a varactor integrated with an FET on a single chip. However, the present invention is applicable to any VCO which includes a variable tuned circuit in the gate circuit of an FET.

The integrated varactor used in the presently preferred embodiment of the present invention includes an interdigitated anode and cathode on a thin epitaxial or implanted layer on a semi-insulating substrate. The epitaxial layer must have a small doping-thickness product, so that punchthrough occurs before breakdown. Preferably the anode forms a Schottky barrier with the epitaxial layer. Preferably, the substrate is Cr-doped GaAs, and the epitaxial layer is n-type GaAs. As punchthrough occurs, the effective area of the anode (and hence the capacitance) changes from a large depletion boundary below the surface anode to an approximately vertical section through the epitaxial layer. Since the substrate is semi-insulating, punch-through does not become catastrophic.

Thus, no additional elements, aside from those specifically required for the tuned circuit which is connected to the gate, must be introduced to set the bias point. Since additional and spurious reactances are not inserted, the bandwidth of the VCO can be made as broad as possible. In particular, the frequency bandwidth of the VCO can be a substantial fraction of the bandwidth which may be attained in the variable tuned circuit which is used to control the gate.

The present invention offers the further processing advantage, in the preferred embodiment, that the gate of the FET and the anode of the varactor are both Schottky barrier contacts, and may be formed simultaneously using the same materials.

According to the present invention, there is provided: a voltage-controlled oscillator, comprising: an FET comprising a source, gate, and drain, all atop a semiconducting layer, said gate being interposed between said source and said drain, and said gate forming a Schottky barrier contact with said semiconducting layer; a varactor connected to said gate; and biasing means connected to provide a selected voltage to said varactor; wherein no pathway for DC return exists between said gate and said source or between said gate and said drain.

BRIEF DESCRIPTION OF THE DRAWINGS

The present invention will be described with reference to the accompanying drawings, wherein:

FIG. 4 compares the capacitance/voltage characteristics of a single-finger and of a six-finger varactor (both analogous to that of FIG. 1) suitable for use in the present invention; and, FIG. 5 shows first and second embodiments of a VCO incorporating the present invention.

DESCRIPTION OF THE PREFERRED EMBODIMENTS

The presently preferred embodiment of the present invention relates to a monolithic varactor-tuned VCO, and the invention will be described with primary reference to such an embodiment. However, the present invention is in general applicable to any VCO which uses: (1) an FET output stage, and (2) a variable—resonance tuned circuit connected to the gate of the FET.

The gate-source Schottky barrier diode is forward biased during a portion of the positive-going RF signal. This rectified voltage is discharged very slowly during the remainder of the RF cycle, since all discharge paths have very high resistance (ca. 1 megohm). If no further RF clipping occurs, the gate-source capacitance will gradually be discharged down to the built-in voltage of the Schottky barrier, at which point the FET would operate at $I_{Dss}$ drain-source current. In equilibrium, the amount of charge is pumped into the gate circuit during the small fraction of the RF cycle in which the Schottky barrier is forward biased will equal the amount of charge which leaks out over the leakage resistances during the whole RF cycle, thereby maintaining a constant bias voltage on the gate.

The bias-point which is set on a gate by the present invention is typically on the order of 1-2 volts, at moderate power output. However, it is of course difficult to precisely measure the voltage of the small quantities of charge involved at the high microwave frequencies involved.

Figure 1:
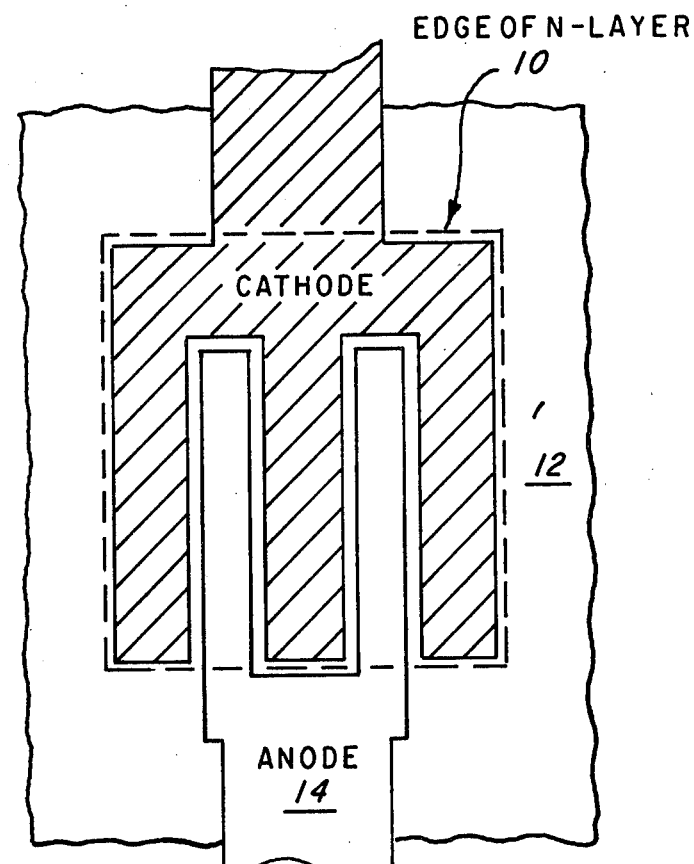
FIG. 1 is a top view of a varactor diode suitable for use in the present invention.

FIG. 1 is a top plan view of a varactor used in the presently preferred embodiment of the present invention. Ion implantation (e.g., $5 \times 10^{12}/cm^2$ of Si at 200 keV) forms an n-type layer 10 on a semi-insulating substrate (preferably Cr-doped GaAs). Alternatively epitaxial growth may be used to form the layer 10. An anode 14 and a cathode 16 are then formed in an interdigitated relation above the n-type layer 10. The anode forms a Schottky barrier with respect to the n-type layer 10, and the cathode 16 forms an ohmic contact.

Each finger of the anode is preferably 6 microns wide and 150 microns long. The anode is a deposited layer of, for example, Ti/Pt/Au. The spacing between the anode and cathode is nominally 2 microns.

Figure 2:
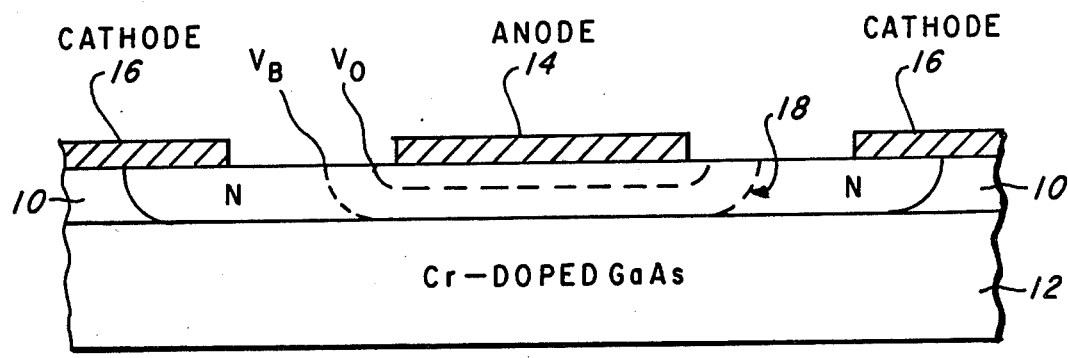
FIG. 2 is a cross-sectional elevation of one finger of the varactor diode of FIG. 1.

FIG. 2 shows a cross section across one finger of the anode 14 and portions of two fingers of the cathode 16. The dotted lines $V_0$ and $V_b$ show the respective depletion regions adjacent the anode at 0 volts and at the breakdown voltage, respectively. As these curves show, the effective area of the anode between the punch through voltage and the breakdown voltage is limited to only the approximately vertical portion 18 of the depletion boundary $V_b$. By contrast, at 0 bias the anode 14 has the effective area shown by the depletion boundary $V_0$, which is slightly larger than the physical area of the anode 14 itself.

Thus, a wide capacitance ratio is achieved, because the doping/thickness product of the epitaxial layer 10 is controlled to allow punch through before breakdown. In the preferred embodiment, the layer 10 is 300 nanometers thick. If the thickness is greater than 300 nm, the concentration of impurities should be reduced proportionately. At punch through, the effective diode area is reduced to that of the sidewall. As a result, a very large capacitance ratio is achieved by proper choice of the geometry.

In practice, a tradeoff must be made between the Q and the capacitance ratio. The Q is limited by the parasitic series resistance for current flowing laterally under the anode before punch-through. Since the current beneath the anode is confined to the region of epitaxial layer 10 which lies beneath the depletion boundary and this layer becomes thinner as the depletion boundary approaches punch-through, a large effective series resistance appears just before punch-through.

After punch-through, this series resistance is reduced to that of only the region from the vertical depletion boundary 18 to the cathode 16, and very high Q's are observed. This series resistance is, of course, larger if the finger width is larger.

To reduce the punch-through voltage, a recess may be etched out under the whole surface of the anode, before the anode metallization is deposited. Thus, for example, where the layer 10 is 300 nanometers thick, 100 nanometers would be etched away before the anode is deposited. Thus, the punch-through voltage is reduced, since the anode is accordingly closer to the substrate, whereas the breakdown voltage is not reduced, since the anode is no closer to the cathode. In fact, the breakdown voltage may be slightly increased, since the surface portions of the layer 10 are likely to be slightly more heavily doped than the lower portions of the layer 10. Since such recessed structures are frequently used for the channel regions of microwave FETs, to reduce the series resistance of the source and drain regions adjacent the channel, such an anode recess is also compatible with familiar microwave integrated circuit technology. An anode which is recessed in this fashion, to approximately $\frac{1}{3}$ of the depth of the layer 10, constitutes the presently preferred embodiment of the varactor.

Figure 3:
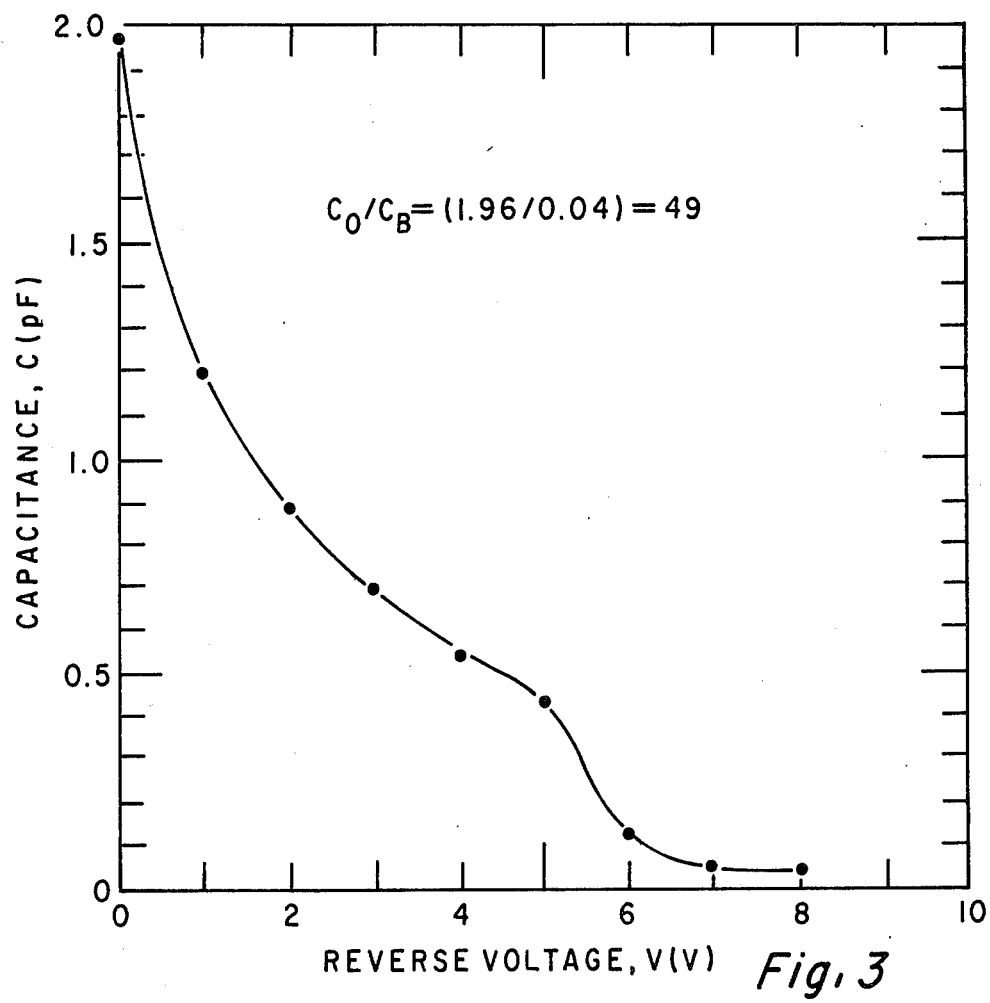
FIG. 3 shows a sample capacitance/voltage curve of the varactor of FIG. 1.

FIG. 3 shows the capacitance/voltage characteristics of a varactor constructed for use in the present invention. A 6 by 150 micron Ti/Pt/Au anode finger is placed between cathode areas two microns away. The layer 10 is 300 nm thick n-type ion implanted gallium arsenide, like that used for FETs. The substrate is chromium doped gallium arsenide. The anode is placed in a 100 nm etched recess, so that the anode is 200 nm above the substrate. In this embodiment, the capacitance decreases from 1.96 pF at 0 bias to 0.04 pF at −7 volts. This 49 to 1 capacitance ratio is achieved because of the extremely rapid capacitance decrease as punch through occurs between 5 and 7 volts. Calculated cutoff frequency for this diode is 28 GHz at 0 volts bias and 2.5 THz at 10 volts.

Of course, multi-finger embodiments of this planar varactor design may also be constructed.

The implantation parameters which optimize the n-type region 10 for construction of the varactor may be slightly different from those used to optimize the epitaxial layer for construction of FETs. For example, a slightly lower implantation dose (e.g. $3 \times 10^{12}/cm^2$) at a slightly higher energy (e.g. 400 KeV) would be used to construct a varactor to obtain higher breakdown voltage. Thus, selective implantation of a monolithic chip containing both varactors and FETs would permit optimization of performance. However, the required characteristics for FETs and for the varactor are sufficiently close that, although selective implantation can provide a marginal advantage and performance, it is not required.

Passivation, in the presently preferred embodiment, is achieved by the following sequence of processing steps: First, the cathode metallization is deposited. Then 1000 Angstroms of silicon nitride are deposited over the whole surface of the device. The anode recess is then patterned and etched, to approximately ⅓ of the thickness of the layer 10. The anode metallization is then deposited, and any necessary contacts are then formed. Finally, 3000 Angstroms more of silicon nitride are deposited overall. Clean-up, at appropriate intermediate points of the process, is performed using, e.g., ammonium hydroxide and water.

To further improve varactor performance, by further increasing the breakdown voltage, additional steps may alternatively be inserted to reduce the density of surface states. For example, an additional etching step may be applied overall, after the anode has been deposited, or an additional reagent may be used for clean-up.

Nitride assisted lift-off, if used to form the anode 14, improves the breakdown voltage of the varactors of the present invention. This technique places the anode metal back from the edge of the etched recess, and passivates the surface of the gallium arsenide. The parameters for this process are well known to those skilled in the art. (see, e.g. Proceedings of the Cornell Conference on Microwave Semiconductor Devices, 1981, p. 157, "High Yield, Reproducible process Techniques for microwave GaAs FETs", G. E. Brehm, F. H. Doerbeck, W. R. Frensley, H. M. Macksey, and R. E. Williams).

As will be obvious to those skilled in the art, numerous modifications may be performed, within the scope of the inventive concepts described above, to construct a varactor for use in the present invention. For example, p-type material could be used in the layer 10, although different metal composition would be required to create a Schottky barrier contact. Other semiconductor materials could also be used, provided that a doped semiconducting layer was lattice-matched to a semi-insulating substrate.

Figure 5B:
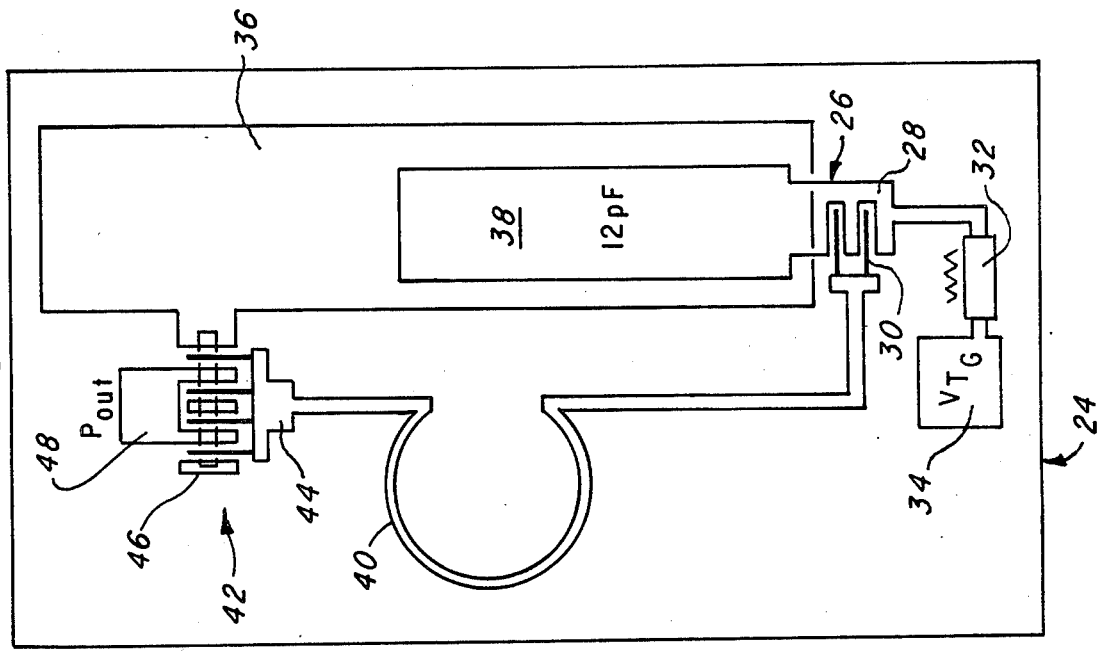
Figure 5A:
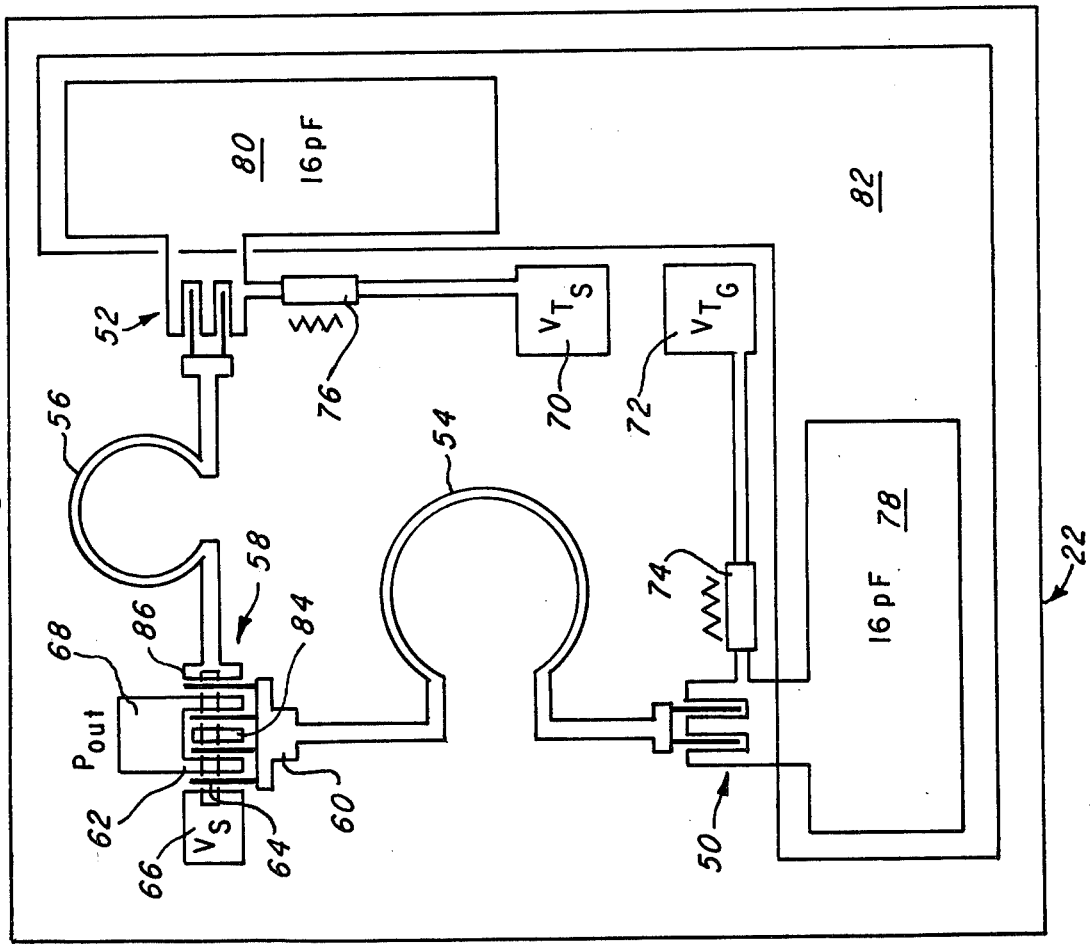

Two embodiments of integrated microwave wideband VCOs incorporating the present invention are shown in FIG. 5. The VCO circuit 22, shown on the left, represents the presently preferred embodiment. The VCO 22 is a "common gate" oscillator, having loop inductors 54 and 56 and varactors 50 and 52 respectively connected from the gate and source terminals of FET 58 to RF ground. MIM capacitors 78 and 80 (each 16 pF) to ground are used for RF bypassing, and 2.5 kilohm GaAs resistors are included at 74 and 76 are included in the high impedance bias lines to help suppress low frequency oscillations, to aid in isolating the DC bias lines from RF, and to act as a DC current limit. Bonding pads 72 and 70 are respectively provided for the gate and source tuning varactor voltages and pad 66 for DC-grounding of the source 64. External means of biasing the drain 62 and of matching the drain output 68 to 50 ohms must be provided.

No DC return is provided for the gate, since the bias point for the gate is established by clipping the RF gate voltage. This occurs in the FET 58, as described below.

While the structure of the FET is in almost all respects conventional, it does have one important feature which cooperates in the novel operation of the VCO according to the present invention. The gate fingers form a Schottky barrier with the channel region, and thus RF voltages in the gate circuit are clipped by the Schottky barrier to form the necessary gate bias. This has the outstanding advantage that the gate tuning network in the present invention consists simply of the inductor 54 and the varactor 50, and other circuits normally required to establish the gate operating point, which would have high frequency resonances, are not included. This permits easy operation of a microwave oscillator over an extremely broad bandwidth.

Thus, the processing steps required to form the monolithic VCO in the presently preferred embodiment of the present invention are as follows: the starting material is an n-type epitaxial (or implanted) layer on a semi-insulating substrate, preferably n-type GaAs on a CR-doped GaAs substrate. 1. A mesa etch step is first. Photoresist is applied and patterned, and the epitaxial layer is then etched accordingly, to remove all portions of the epitaxial layer which are not needed. For example, portions of the epitaxial layer are left where the varactors 50 and 52 will be formed, and where the channel region of FET 58 will be formed. Portions of the epitaxial layer are also used to form the resistance elements 74 ad 76. 2. Alignment marks are then deposited and etched, to provide E-beam control. A silicon nitride protective layer, of e.g. 1000 Angstroms, is then deposited only over the align marks. (Alignment marks are not shown within the VCO 22 of FIG. 5, but the positioning and use of E-beam alignment marks within a wafer is well known to those skilled in the art.) 3. Ohmic contacts are then formed. Photoresist is deposited and patterned to form the source and drain regions of FET 58, and the respective cathodes of varactors 50 and 52. Au/Ge/Ni is then deposited, lift-off is performed, and alloying is then performed, all conventionally. 4. The next stage is gate patterning. 1000 Angstroms of silicon nitride is deposited over all. E-beam resist is deposited, and E-beam patterning is then applied to define the gate fingers of FET 58 and the anode fingers of varactors 50 and 52. The silicon nitride in these patterns is then etched, and the epitaxial layer is then etched, to approximately one third of its thickness, where it has been exposed. Thus, where the epitaxial layers 3000 Angstroms thick, approximately 1000 Angstroms will be etched away in the present step. Ti/Pt/Au is then deposited, to form Schottky barriers to the epitaxial layer within these etched recesses, for the gate and anodes. Lift-off is then performed. 5. A first-level metallization step is then performed. 4000 Angstroms of silicon nitride is deposited overall, and photoresist patterning and etching of the nitride is performed (conventionally) to define the first metallization. This includes the bottom plate 82 of the capacitors 78 and 80, the inductors 54 and 56, the contact pads 66, 68, 70, and 72, and most of the remaining wiring. The patterning at this stage also exposes the source and drain fingers of the FET in the cathodes of the varactors 50 and 52, so that more metal is deposited on these structures to lower their resistance. Lift-off is then performed conventionally. 6. A top plate patterning step is then applied. First, 3000 Angstroms of silicon nitride are deposited overall. This nitride forms a passivating layer over the varactors 50 and 52, and also forms the dielectric layer of the two RF-grounding capacitors 78 and 80. The top plates of capacitors 78 and 80 are then patterned (using photoresist), and TiAu is then deposited. Lift-off is then conventionally performed. 7. Finally, air-bridge connections are formed. First, photoresist is patterned to form vias, where (e.g.) the air bridge 64 contacts the source contact 66, the middle source finger 84, and the source finger 86. Nitride etching is then performed where the vias have been patterned, and pure gold is deposited by sputtering. The photoresist is *not* removed, but is left in place, since it will be needed to support the air-bridge 64. A further layer of photoresist is then deposited, and patterned to form the actual air bridge connection, and gold is then deposited by electroplating. All photoresist is then stripped. As is well-known in the art, such air-bridge structures have the advantage of reducing stray capacitance. For clarity, only one air-bridge connection is shown in FIG. 5, (across the source fingers of FET 58), but air-bridge connections are also generally used to connect first- and second-level metallizations. Thus, air-bridges are also preferably formed between varactor 50 and the top plate of capacitor 78, and between varactor 52 and capacitor 80.

Thus, the monolithic VCO 22 is connected to a power supply across source terminal 66 and drain terminal 68, and provides oscillator output power at terminal 68. The source tuning terminal 70 and the gate tuning terminal 72 are used to provide bias voltages which respectively control the varactors 52 and 50. The varactor 50 is the primary tuning reactance for the VCO, and the varactor 52 is used to tune the source circuit, to provide optimal matching for broad-band capability.

The VCO 24 is generally similar, but the source-matching circuit is not included. The VCO 24 includes an FET 42, an inductance 40 and varactor 26 in the gate line of FET 42, and an RF-grounding capacitor 38 and a bias supply 32 and 34 connected to the cathode of the varactor 26. Since this VCO 24 does not have the source-matching circuit to provide wide-band impedance matching, its potential bandwidth is only about 25% of that of the VCO 22. However, the VCO 24 does provide two advantages over the VCO 22. First, the VCO 24 is physically smaller. Second, the VCO 24 is preferably operated in the common-drain mode, i.e. the polarities of the off-chip source and drain connections are reversed from those used with VCO 22. Where the VCO 24 is constructed with 300-micron total gate width, the source terminal provides an output impedance very close to 50 ohms, so that no separate impedance-matching is required. Thus, where the broad-band capabilities of VCO 22 are not required, VCO 24 may be preferable. Like the VCO 22, the VCO 24 contains the innovative provision discussed above for gate bias, without any DC return line.

The present invention is not limited to the preferred embodiments described above. In particular, the present invention applies to hybrid waveguide, and wired configuration of a VCO, as well as to monolithic configurations.

What we claim is:

1. An integrated voltage-controlled oscillator (VCO), comparising:
   a monocrystalline substrate including a semiconducting layer;
   an FET comprising a source contact, a gate, and a drain contact, all atop said semiconducting layer, said gate being interposed between said source contact and said drain contact, and said gate forming a Schottky barrier contact with said semiconducting layer; and
   a variable-resonance tuned circuit connected to said gate and comprising a plurality of reactances at the surface of said substrate, said plurality of reactances including at least one variable reactance direct current coupled to said gate;
   wherein no bidirectional pathway for DC return exists between said gate and said source nor between said gate and said drain.

2. The VCO of claim 1, wherein said variable-resonance tuned circuit comprises a varactor together with an inductive reactance, and biasing means connected to provide a selected voltage to said varactor.

3. The VCO of claim 2, wherein said varactor comprises an anode and a cathode, and wherein a Schottky barrier exists therebetween.

4. The VCO of claim 3, wherein said gate of said FET is connected, via said inductive reactance, to said anode of said varactor.

5. The VCO of claim 1, wherein said monocrystalline substrate consists essentially of HgCdTe.

6. The VCO of claim 5, wherein said monocrystalline substrate apart from said semiconducting layer is semi-insulating.

7. The VCO of claim 1, wherein said variable-resonance tuned circuit consists of an inductance connected to said gate, and a varactor comprising first and second terminals, said first terminal of said varactor being connected to said inductance.

8. The VCO of claim 1, wherein said gate is connected to said variable-resonance tuned circuit by a patterned metal strip atop said substrate.

* * * * *